United States Patent
Kim

(10) Patent No.: US 9,806,027 B2
(45) Date of Patent: Oct. 31, 2017

(54) SEMICONDUCTOR DEVICE

(71) Applicant: SAMSUNG ELECTRONICS CO., LTD., Suwon-si, Gyeonggi-do (KR)

(72) Inventor: Daeshik Kim, Hwaseong-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 6 days.

(21) Appl. No.: 14/460,692

(22) Filed: Aug. 15, 2014

(65) Prior Publication Data

US 2015/0123282 A1 May 7, 2015

(30) Foreign Application Priority Data

Nov. 5, 2013 (KR) .................. 10-2013-0133749

(51) Int. Cl.
| | |
|---|---|
| *H01L 23/535* | (2006.01) |
| *H01L 43/08* | (2006.01) |
| *H01L 27/22* | (2006.01) |
| *H01L 43/12* | (2006.01) |

(52) U.S. Cl.
CPC .......... *H01L 23/535* (2013.01); *H01L 27/228* (2013.01); *H01L 43/08* (2013.01); *H01L 43/12* (2013.01); *H01L 2924/0002* (2013.01)

(58) Field of Classification Search
CPC . H01L 27/228; H01L 23/535; H01L 2924/00; H01L 2924/0002
See application file for complete search history.

(56) References Cited

U.S. PATENT DOCUMENTS

| | | |
|---|---|---|
| 6,998,665 B2 | 2/2006 | Motoyoshi |
| 7,508,041 B2 | 3/2009 | Noh et al. |
| 7,564,109 B2 | 7/2009 | Kajiyama et al. |
| 7,821,086 B2 | 10/2010 | Kajiyama |
| 8,455,965 B2 | 6/2013 | Li et al. |
| 8,482,966 B2 | 7/2013 | Kang et al. |
| 8,535,952 B2 | 9/2013 | Ranjan et al. |
| 2004/0113175 A1* | 6/2004 | Motoyoshi ............. B82Y 10/00 257/200 |
| 2004/0127054 A1 | 7/2004 | Lee et al. |
| 2008/0185670 A1 | 8/2008 | Kajiyama |
| 2009/0261433 A1 | 10/2009 | Kang et al. |
| 2012/0032287 A1 | 2/2012 | Li et al. |
| 2012/0056253 A1 | 3/2012 | Iwayama et al. |
| 2012/0315707 A1 | 12/2012 | Nam |
| 2012/0326250 A1 | 12/2012 | Gaidis et al. |
| 2013/0032908 A1 | 2/2013 | Tang et al. |

FOREIGN PATENT DOCUMENTS

| | | |
|---|---|---|
| KR | 10-2006-0008166 A | 1/2006 |
| KR | 10-2013-0038603 A | 4/2013 |

\* cited by examiner

*Primary Examiner* — Laura Menz
*Assistant Examiner* — Candice Y Chan
(74) *Attorney, Agent, or Firm* — Lee & Morse P.C.

(57) ABSTRACT

A semiconductor device includes an interlayer dielectric on a semiconductor substrate, a contact plug penetrating the interlayer dielectric, a pillar pattern disposed on the interlayer dielectric and having a central axis laterally offset from a central axis of the contact plug, a pad extending on the contact plug and along a sidewall of the pillar pattern, the pad being electrically connected to the contact plug, and a data storage portion on the pillar pattern and electrically connected to the pad.

20 Claims, 12 Drawing Sheets

SEMICONDUCTOR DEVICE

CROSS-REFERENCE TO RELATED APPLICATION

Korean Patent Application No. 10-2013-0133749, filed on Nov. 5, 2013, in the Korean Intellectual Property Office, and entitled: "Semiconductor Device," is incorporated by reference herein in its entirety.

BACKGROUND

1. Field

Embodiments described herein generally relate to semiconductors and, more particularly, to data storage devices.

2. Description of the Related Art

Semiconductor devices are considered important elements in the electronics industry due to their characteristics, e.g., small size, multi-functionality, and/or low manufacturing costs. The semiconductor devices may include a data storage device that can store logic data. The integration density of a data storage device continues to increase with the advance in the electronic industry. As a result, line widths of components constituting the data storage device continue to decrease.

In addition to high integration density of the data storage device, high reliability of the data storage device has been required. However, the high integration of the data storage device may cause the reliability of the data storage device to be deteriorated. Accordingly, many studies have been conducted to improve the reliability of the data storage device.

SUMMARY

Embodiments provide a semiconductor device. In some embodiments, the semiconductor device may include an interlayer dielectric on a semiconductor substrate; a contact plug penetrating the interlayer dielectric; a pillar pattern disposed on the interlayer dielectric and having a central axis laterally offset from a central axis of the contact plug; a pad disposed on the contact plug, extending along a sidewall of the pillar pattern, and electrically connected to the contact plug; and a data storage portion provided on the pillar pattern and electrically connected to the pad.

In an exemplary embodiment, the data storage portion may be in contact with an uppermost surface of an extending portion of the pad.

In an exemplary embodiment, a top surface of the pillar pattern may have the same level as an uppermost surface of the pad, and the data storage portion may cover the top surface of the pillar pattern and the uppermost surface of the pad.

In an exemplary embodiment, the extending portion of the pad may further extend between the pillar pattern and the data storage portion.

In an exemplary embodiment, the semiconductor device may further include an upper interlayer dielectric disposed on the interlayer dielectric to cover the sidewall of the pillar pattern and the pad.

In an exemplary embodiment, a central axis of the data storage portion may be laterally offset from a central axis of the contact plug, and the central axis of the data storage portion, the central portion of the contact plug, and the central axis of the pillar pattern may be perpendicular to a top surface of the substrate.

In an exemplary embodiment, the pillar pattern may include a conductive material.

In an exemplary embodiment, the pillar pattern may include an insulating material.

In other embodiments, the semiconductor device may include a substrate including a plurality of memory cells; and an interlayer dielectric covering the substrate. Each of the memory cells includes a contact plug penetrating the interlayer dielectric; a pillar pattern disposed on the interlayer dielectric and having a different central axis from that of the contact plug; a pad covering the contact plug, electrically connected to the contact plug, and extending along a sidewall of the pillar pattern; and a data storage portion disposed on the pillar pattern and electrically connected to the pad.

In an exemplary embodiment, the data storage portion may be in contact with an uppermost surface of an extending portion of the pad.

In an exemplary embodiment, among the memory cells constituting a single row, a distance between central axes of a contact plug and a pillar pattern included in an odd-number-th memory cell may be different from a distance between axes of a contact plug and a pillar pattern included in an even-number-th memory cell.

In an exemplary embodiment, distances between the data storage portions included in the memory cells constituting a single row may be equal to each other.

In an exemplary embodiment, the semiconductor device may further include an upper interlayer dielectric provided between the pillar patterns to cover the pads. An uppermost surface of the upper interlayer dielectric has the same level as an uppermost surface of the pad.

In yet other embodiments, the semiconductor device may include an interlayer dielectric on a semiconductor substrate, a contact plug penetrating the interlayer dielectric, a pillar pattern on the interlayer dielectric and having a central axis laterally offset from a central axis of the contact plug, a data storage portion on the pillar pattern, a pad electrically connecting the data storage portion to the contact plug, the pad continuously extending along a sidewall of the pillar pattern and on at least a portion of the upper surface of the contact plug, and an upper interlayer dielectric on the interlayer dielectric, the upper interlayer dielectric covering the pad.

In an exemplary embodiment, the upper interlayer dielectric completely may cover the pad, a portion of the pad separating the sidewall of the pillar pattern from the upper interlayer dielectric.

In an exemplary embodiment, an uppermost surface of the upper interlayer dielectric may be coplanar with an uppermost surface of the pillar pattern, the data storage portion being above the upper interlayer dielectric.

In an exemplary embodiment, the upper interlayer dielectric may completely separate the data storage portion from an outer lateral side of the pad, the outer lateral side of the pad extending along the sidewall of the pillar pattern.

In an exemplary embodiment, a central axis of the data storage portion may be coextensive with the central axis of the pillar pattern.

In an exemplary embodiment, the data storage portion may be a plurality of data storage portions on a plurality of corresponding pillar patterns, the data storage portions in a same row along a first direction being positioned at equal intervals from each other.

In an exemplary embodiment, the pillar pattern may be above the contact plug along a second direction normal to the substrate, the central axes of the pillar pattern and the contact plug being spaced apart from each other along the first direction perpendicular to the second direction.

BRIEF DESCRIPTION OF THE DRAWINGS

Embodiments will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the embodiments.

DETAILED DESCRIPTION

Figure 1:
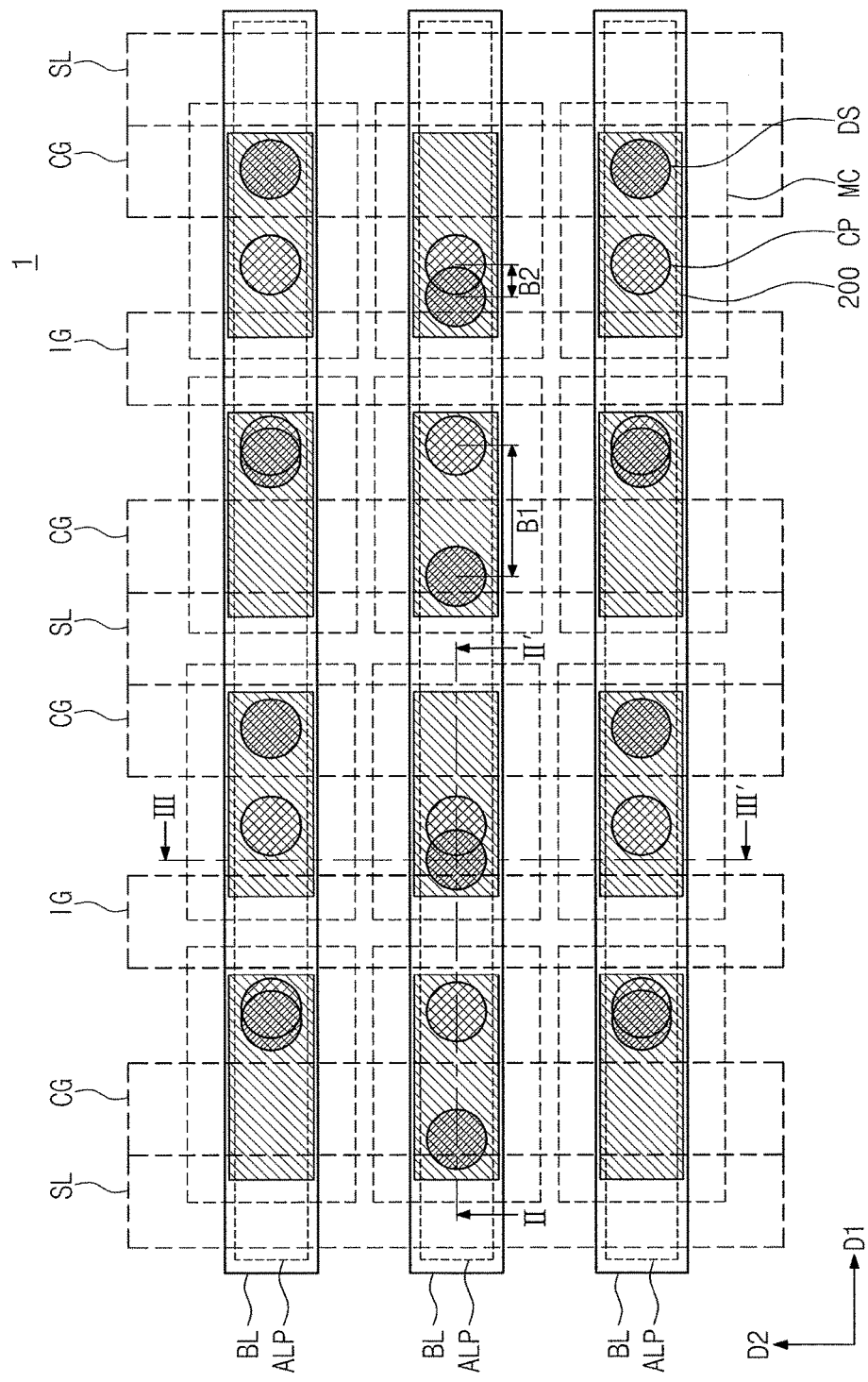
FIG. 1 illustrates a top plan view of a semiconductor device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the specification, it will be understood that when an element is referred to as being "on" another layer or substrate, it can be directly on the other element, or intervening elements may also be present. In the drawings, thicknesses of elements may be exaggerated for clarity of illustration.

Exemplary embodiments will be described below with reference to cross-sectional views, which are exemplary drawings. The exemplary drawings may be modified by manufacturing techniques and/or tolerances. Accordingly, the exemplary embodiments are not limited to specific configurations shown in the drawings, and include modifications based on the method of manufacturing the semiconductor device. For example, an etched region shown at a right angle may be formed in a rounded shape or formed to have a predetermined curvature. Therefore, regions shown in the drawings have schematic characteristics. In addition, the shapes of the regions shown in the drawings exemplify specific shapes of regions in an element, and do not limit. Though terms like a first, a second, and a third are used to describe various elements in various embodiments, the elements are not limited to these terms. These terms are used only to tell one element from another element. An embodiment described and exemplified herein includes a complementary embodiment thereof.

The terms used in the specification are for the purpose of describing particular embodiments only and are not intended to be limiting. As used in the specification, the singular forms "a", "an" and "the" are intended to include the plural forms as well, unless the context clearly indicates otherwise. It will be further understood that the terms "comprises" and/or "comprising", when used in the specification, specify the presence of stated features, integers, steps, operations, elements, and/or components, but do not preclude the presence or addition of one or more other features, integers, steps, operations, elements, components, and/or groups thereof.

Hereinafter, embodiments will be described more fully with reference to accompanying drawings.

Figure 2:
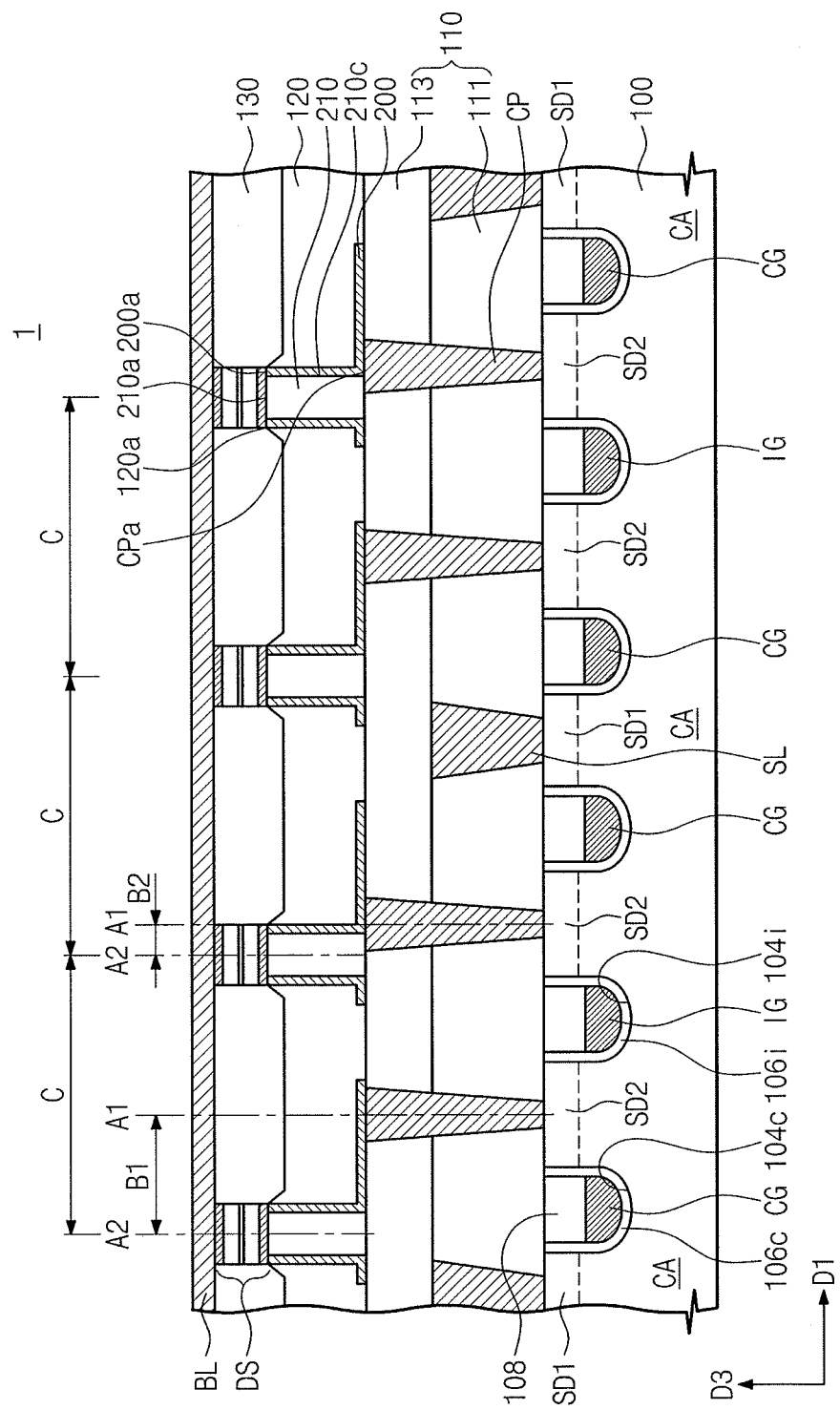
FIG. 2 illustrates a cross-sectional view taken along line II-II' in FIG. 1.

FIG. 1 illustrates a top plan view of a semiconductor device according to an embodiment. FIG. 2 illustrates a cross-sectional view taken along line II-II' in FIG. 1, and FIG. 3 illustrates a cross-sectional view taken along line III-III' in FIG. 1.

Figure 3:
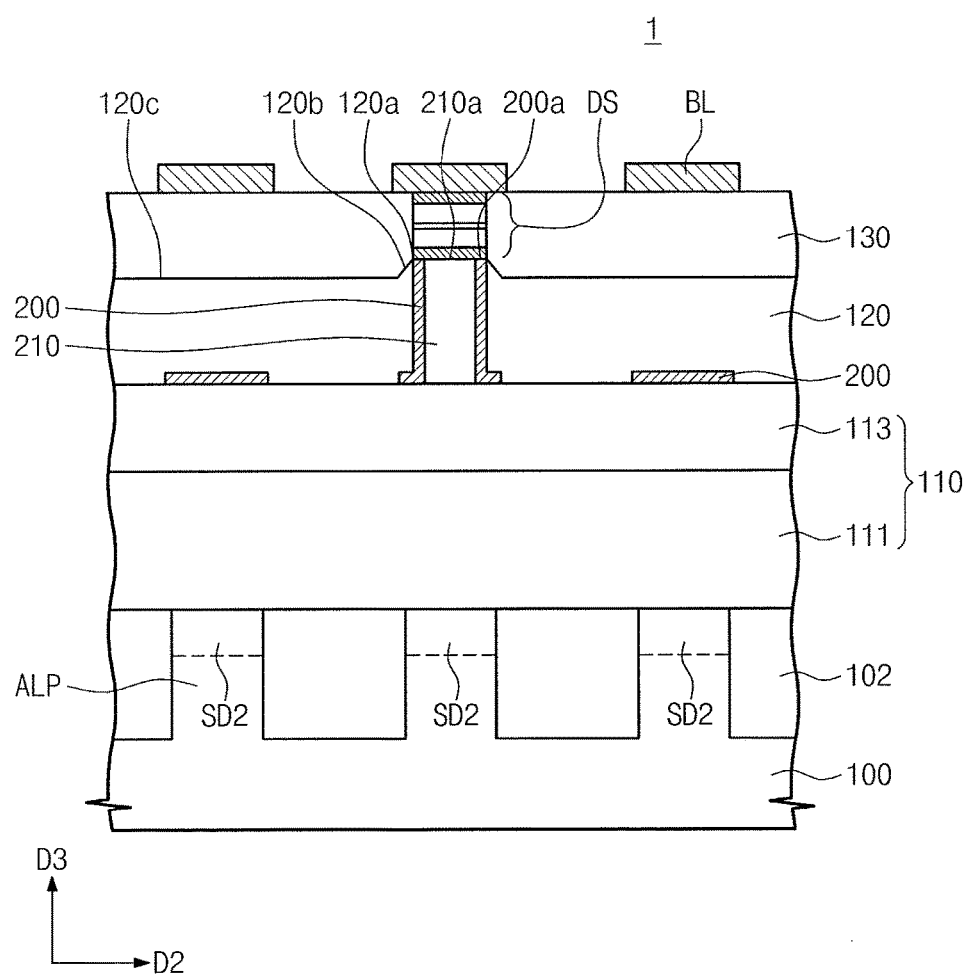
FIG. 3 illustrates a cross-sectional view taken along line III-III' in FIG. 1.

Referring to FIGS. 1 to 3, a substrate 100 may be provided with a plurality of memory cells MC. The substrate 100 may be a semiconductor substrate. For example, the substrate 100 may include silicon, germanium, and/or silicon-germanium. Device isolation patterns 102 may be disposed on the substrate 100 to define active line patterns ALP. When viewed from the top, the device isolation patterns 102 and the active line patterns ALP may extend parallel to each other in a first direction D1. The device isolation patterns 102 and the active line patterns ALP may be alternately arranged in a second direction D2 orthogonal to the first direction D1 (FIG. 3). The active line patterns ALP may include dopants of a first conductivity type.

Recess regions 104i and 104c may intersect the active line patterns ALP and the device isolation pattern 102. The recess regions 104i and 104c may be in the forms of grooves extending parallel to each other in the second direction D2. The recess regions 104i and 104c may include isolation recess regions 104i and gate recess regions 104c. The isolation recess regions 104i may divide each active line pattern ALP into cell active portions CA, e.g., isolation gate electrodes IG in respective isolation recess regions 104i illustrated in FIG. 1 may intersect and divide each active line pattern ALP into the cell active portions CA. Each of the cell active portions CA may be a portion of each active line pattern ALP disposed between a pair of adjacent isolation recess regions 104i. That is, each cell active portion CA may be defined by a pair of adjacent device isolation patterns 102, e.g., along the second direction D2, and a pair of adjacent isolation recess regions 104i, e.g., along the first direction D1. In this case, a pair of cell transistors may be formed in each of the cell active portions CA. A width of each of the gate recess regions 104c may be identical to or different from that of each of the isolation recess regions 104i. A depth of each of the gate and isolation recess regions 104c and 104i may be smaller than that of a bottom surface of each of the device isolation patterns 102. The recess regions 104i and 104c are not limited to this specification and may have various shapes.

Cell gate electrodes CG may be disposed in the gate recess regions 104c, and a cell gate dielectric layer 106c may be disposed between an inner surface of each of the gate recess regions 104c and each of the cell gate electrodes CG. Due to the shape of each of the gate recess regions 104c, each of the cell gate electrodes CG may have a shape of a line extending in the second direction D2. A transistor including each of the cell gate electrodes CG may have a channel region recessed by each of the gate recess regions 104c.

The isolation gate electrodes IG may be disposed in the isolation recess regions 104i, and an isolation gate dielectric layer 106*i* may be disposed between an inner surface of each of the isolation recess regions 104*i* and each of the isolation gate electrodes IG. Each of the isolation gate electrodes IG may have a shape of a line extending in the second direction D2. During operation of a semiconductor device 1, an isolation voltage may be applied to each of the isolation gate electrodes IG. The isolation voltage may prevent formation of a channel below the inner surface of each of the isolation recess regions 104*i*. That is, an isolation channel region below each of the isolation gate electrodes IG is turned off by the isolation voltage. Thus, the cell active portions CA divided from each of the active line patterns ALP may be electrically isolated from each other.

In another embodiment, the cell and isolation gate electrodes CG and IG may be provided on a top surface of the substrate 100. The cell and isolation gate electrodes CG and IG are not limited to this specification and may have various shapes.

Each of the cell gate electrodes CG may include at least one of a dopant-doped semiconductor material (e.g., doped silicon, etc.), metal (e.g., tungsten, aluminum, titanium, and/or tantalum), conductive metal nitride (e.g., titanium nitride, tantalum nitride, and/or tungsten nitride), and a metal-semiconductor compound (e.g., metal silicide). The isolation gate electrode IG may include the same material as the cell gate electrode CG. Capping patterns 108 may fill the recess regions 104*c* and 104*i* on the cell and isolation gate electrode CG and IG. The capping patterns 108 may include, e.g., silicon oxide, silicon nitride, and/or silicon oxynitride. The cell gate dielectric layer 106*c* and the isolation gate dielectric layer 106*i* may include, e.g., silicon oxide, silicon nitride, silicon oxynitride, and/or a high-k dielectric (e.g., insulating metal oxide).

A first doped region SD1 may be disposed in each cell active portion CA at a first side of each cell gate electrode CG, and a second doped region SD2 may be disposed in each cell active portion CA at a second side of each cell gate electrode CG. In an embodiment, the first doped region SD1 may be disposed in each cell active portion CA between a pair of adjacent cell gate electrodes CG, and a pair of second doped regions SD2 may be disposed at two edge regions of each of the cell active portion CA with the pair of cell gate electrodes CG interposed therebetween, respectively. The first and second doped regions SD1 and SD2 may correspond to source/drain regions of a cell transistor. The first and second doped regions SD1 and SD2 may be doped with dopants of a second conductivity type differing from the first conductivity type of each cell active portion CA. One of the dopants of the first conductivity type and the dopants of the second conductivity type may be an N-type dopant, and the other may be a P-type dopant.

A first interlayer dielectric 110 may be disposed on the substrate 100. The first interlayer dielectric 110 may include a first lower interlayer dielectric 111 and a first upper interlayer dielectric 113. The first lower interlayer dielectric 111 may include, e.g., oxide, nitride, and/or oxynitride. A source line SL may be electrically connected to the first doped region SD1 through the first lower interlayer dielectric 111. Source lines SL may extend parallel to each other in the second direction D2. A top surface of the source line SL may be substantially coplanar with a top surface of the lower interlayer dielectric 111. The source line SL may include a conductive material. For example, the source line SL may include at least one of a semiconductor material doped with a dopant, a metal, a conductive metal nitride, and/or a metal-semiconductor compound. The first upper interlayer dielectric 113 may be disposed on the first lower interlayer dielectric 111 and the source line SL. The first upper interlayer dielectric 113 may include, e.g., oxide, nitride, and/or oxynitride.

The plurality of memory cells MC may be provided on the substrate 100. The memory cells MC may be two-dimensionally disposed on the substrate 100 (FIG. 1). For example, the memory cells MC may be arranged along rows of a first direction D1 and columns of a second direction D2. Each of the memory cells MC may include a contact plug CP, a pad 200, a pillar pattern 210, and a data storage portion DS. Each of the memory cells MC may be a magnetic memory cell.

As illustrated in FIG. 2, the contact plug CP may be electrically connected to the second doped region SD2 of the substrate 100 through the first interlayer dielectric 110. The contact plug CP may include, e.g., a metal (e.g., tungsten, aluminum, titanium, and/or tantalum) and/or a conductive metal nitride (e.g., titanium nitride, tantalum nitride, and/or tungsten nitride).

The pillar pattern 210 may be disposed on the first interlayer dielectric 110. The pillar pattern 210 may protrude onto, e.g., from, a top surface of the first interlayer dielectric 110. For example, the pillar pattern 210 may protrude in a third direction D3. The third direction D3 may be orthogonal to both the first direction D1 and the second direction D2. A central axis A2 of the pillar pattern 210 may be laterally, e.g., horizontally, offset along the first direction D1 from a central axis A1 of the contact plug CP. The central axes A1 and A2 of the pillar pattern 210 and the contact plug CP may be perpendicular to a top surface of the substrate 100. For example, the central axes A1 and A2 may be parallel to, e.g., extend along, the third direction D3. The pillar pattern 210 may include a conductive material or an insulating material. Among memory cells MC constituting a single row along the first direction D1, a distance between central axes A1 and A2 of a pillar pattern 210 and a contact plug CP of one memory cell MC may be different from a distance between central axes A1 and A2 of a pillar pattern 210 and a contact plug CP of an adjacent memory cell MC along the first direction D1. For example, as illustrated in FIGS. 1-2, among memory cells MC constituting the middle row, a distance B1 between central axes A1 and A2 of a pillar pattern 210 and a contact plug CP of an odd-number-th memory cell MC may be different from a distance B2 between central axes A1 and A2 of a pillar pattern 210 and a contact plug CP of an even-number-th memory cell MC, e.g., the distance B1 in the first and third memory cells MC illustrated in FIGS. 1-2 is larger than the distance B2 in the second and fourth memory cells MC in the same row. For example, a pillar pattern 210 of an odd-number-th memory cell MC may not overlap a contact plug CP, and a pillar pattern 210 of an even-number-th memory cell MC may overlap the contact plug CP. The respective rows may be parallel to the first direction D1.

The pad 200 may be disposed on the first interlayer dielectric 110. At least a portion of a top surface CPa of the contact plug CP may be covered with the pad 200. The pad 200 may be electrically connected to the contact plug CP. The pad 200 may extend, e.g., continuously, along the first interlayer dielectric 110 and along a sidewall 210*c* of the pillar pattern 210. An uppermost surface 200*a* of an extending portion of the pad 200 may have the same level as, e.g., may be coplanar with, a top surface 210*a* of the pillar pattern 210. The pad 200 may include a conductive material, e.g., metal and/or metal nitride. For example, the pad 200 may include titanium nitride. In an embodiment, the pad 200 may include the same material as the pillar pattern 210. In this case, the pillar pattern 210 may include a conductive material. In another embodiment, the pad 200 may include a different material than the pillar pattern 210. In this case, the pillar pattern 210 may include a conductive material or an insulating material.

The data storage portion DS may be provided on, e.g., directly on, the pillar pattern 210. The data storage portion DS may have a different central axis than the contact plug CP, e.g., the data storage portion DS may have a same central axis as a corresponding pillar pattern 210. For example, the central axis of the data storage portion DS may be laterally offset from the central axis A1 of the contact plug CP along the first direction D1. The central axis of the data storage portion DS may be perpendicular to the top surface of the substrate 100. Among the memory cells MC constituting a single row, a distance between central axes of a data storage portion DS and a contact plug CP of an odd-number-th memory cell MC may be different from a distance between central axes of a data storage portion DS and a contact plug CP of an even-number-th memory cell MC. In the memory cells MC constituting a single row, distances C between adjacent data storage portions DS may be equal to each other.

In two adjacent rows along the second direction D2, a data storage portion DS of each of memory cells MC constituting one row may be disposed at a position spaced at a regular pitch in the first direction D1 apart from a data storage portion DS of each of memory cells MC constituting another row, e.g., each data storage portion DS in a bottom row of memory cells MC in FIG. 1 is at a same horizontal and diagonal distance from a data storage portion DS of a corresponding memory cell MC in a middle row of memory cells MC in FIG. 1. For example, a data storage portion DS of an odd-number-th row and a data storage portion DS of an even-number-th may be alternately arranged in the second direction D2, e.g., in a zigzag pattern along the second direction D2 as illustrated in FIG. 1. The arrangement of data storage portions DS according to embodiments may be advantageous in high integration.

The data storage portion DS may cover the top surface 210a of the pillar pattern 210 and the uppermost surface 200a of the pad 200. The data storage portion DS may be electrically connected to the contact plug CP through the pad 200. In an embodiment, if the pillar pattern 210 includes an insulating material, the data storage portion DS may be electrically connected to the contact plug CP by contacting the uppermost surface 200a of the pad 200. In another embodiment, if the pillar pattern 210 includes a conductive material, the data storage portion DS may be electrically connected to the pillar pattern 210 and the pad 200.

A second interlayer dielectric 120 may cover the pad 200. For example, the second interlayer dielectric 120 may be provided on the pad 200, i.e., cover the portion of the pad 200 on the contact plug CP and the portion of the pad 200 extending onto a sidewall 210c of the pillar pattern 210. An uppermost surface 120a of the top surface of second interlayer dielectric 120 may have the same level as the uppermost layer 200a of the pad 200. For example, as illustrated in FIG. 3, the top surface of the second interlayer dielectric 120 may include the uppermost surface 120a, a lowermost surface 120c that is substantially planar and is longer than the uppermost surface 120a, and an intermediate surface 120b connecting the uppermost surface 120a to the lowermost surface 120c, e.g., the intermediate surface 120b may be inclined at an oblique angle with respect to the lowermost surface 120c. The second interlayer dielectric 120 may include, e.g., silicon oxide, silicon nitride, and/or silicon oxynitride.

A third interlayer dielectric 130 may be disposed on the second interlayer dielectric 120. The third interlayer dielectric 130 may be provided on a top surface of the second interlayer dielectric 120 and on a sidewall of the data storage portion DS. The third interlayer dielectric 130 may include, e.g., silicon oxide, silicon nitride, and/or silicon oxynitride.

Bitlines BL may be disposed on the third interlayer dielectric 130. The bitlines BL may be arranged parallel to each other in the first direction D1. The bitlines BL may include a conductive material, e.g., a metal. The bitlines BL may be commonly connected to data storage portions DS of memory cells MC constituting a single row, respectively, as illustrated in FIG. 2. Distances C between the data storage portions DS commonly connected to a same bitline BL may be equal to each other. In an embodiment, each of the bitlines BL may be in direct contact with a top surface of the data storage portion DS. In another embodiment, each of the bitlines BL may be electrically connected to the data storage portion through an upper contact plug (not shown).

Figure 4:
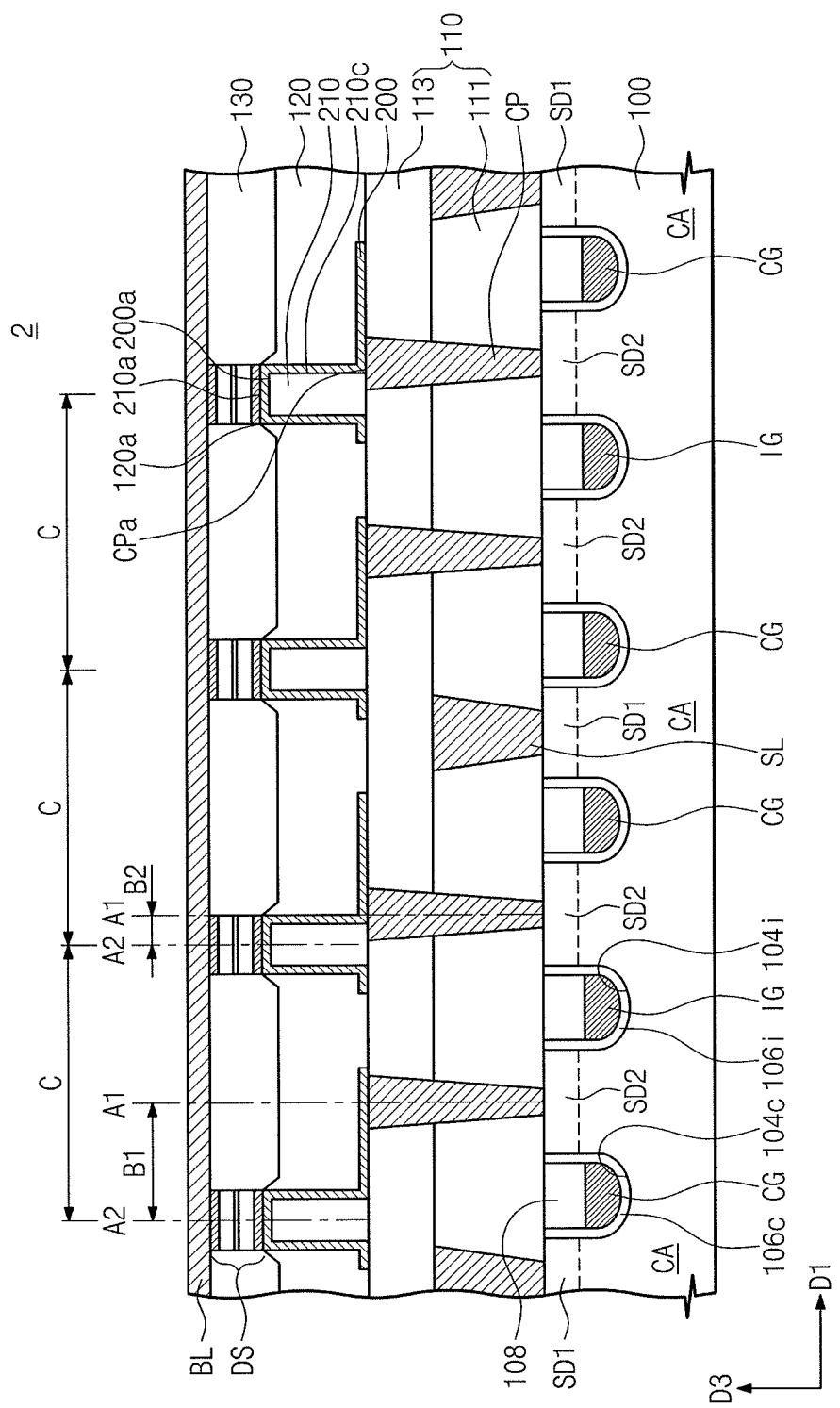
FIGS. 4 and 5 illustrate cross-sectional views of semiconductor devices according to different embodiments along lines II-II' and III-III' in FIG. 1, respectively.
Figure 5:
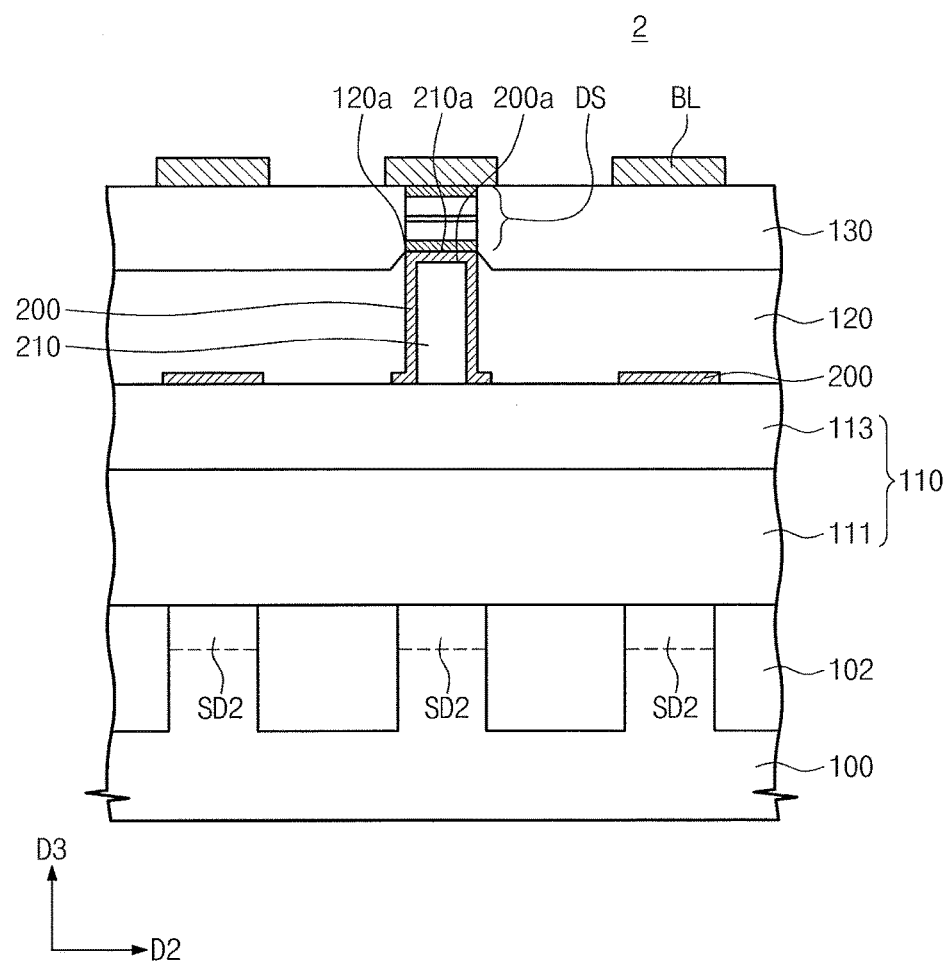

FIGS. 4 and 5 illustrate cross-sectional views of semiconductor devices according to different embodiments, which are taken along lines II-II' and III-III' in FIG. 1, respectively. Hereinafter, duplicate explanations will be omitted.

Referring to FIGS. 1 and 4-5, a semiconductor device 2 may include the substrate 100 with the plurality of memory cells MC. For example, the substrate 100 may include the device isolation patterns 102 to define the active line patterns ALP, the source line SL, the isolation gate electrodes IG, and the cell gate electrodes CG. The first doped region SD1 may be disposed in each cell active portion CA at one side of each of the cell gate electrodes CG, and the second doped region SD2 may be disposed in each cell active portion CA at the other side of each of the cell gate electrodes CG. The interlayer dielectrics 110, 120, and 130 may be provided on the substrate 100.

The plurality of memory cells MC may be provided on the substrate 100. Each of the memory cells MC may include the contact plug CP, the pad 200, the pillar pattern 210, and the data storage portion DS. The central axis of the pillar pattern 210 may be laterally offset from the central axis of the contact plug CP. As shown in FIG. 1, among memory cells MC constituting a single row, the distance B1 between central axes A1 and A2 of a pillar pattern 210 and a contact plug CP of an odd-number-th memory cell MC may be different from a distance B2 between central axes A1 and A2 of a pillar pattern 210 and a contact plug CP of an even-number-th memory cell MC.

The pad 200 may cover the top surface CPa of the contact plug CP and a sidewall 210c of the pillar pattern 210 on the first interlayer dielectric 110. The pad 200 may extend onto the top surface 210a of the pillar pattern 210. For example, the pad 200 may be provided between the top surface 210a of the pillar pattern 210 and the data storage portion DS. The uppermost surface 200a of the pad 200 may have a higher level than the top surface 210a of the pillar pattern 210. The data storage portion DS may be disposed on, e.g., directly on, the pillar pattern 210 and cover the uppermost surface 200a of the pad 200, e.g., the uppermost surface 200a of the pad 200 may completely separate the data storage portion DS from the top surface 210a of the pillar pattern 210. The data storage portion DS may be electrically connected to the contact plug CP and the second doped region SD2 through the pad 200. The central axis of the data storage portion DS may be laterally offset from the central axis A1 of the contact plug CP. The second interlayer dielectric 120 may be disposed on the first interlayer dielectric 110. The second interlayer dielectric 120 may be on the top surface CPa of the contact plug CP and the sidewall of the pillar pattern 210 to cover the pad 200. An uppermost surface 120a of the second interlayer dielectric 120 may have the same level as the uppermost surface 200a of the pad 200. Distances C between central axes of adjacent data storage portions DS included in memory cells MC constituting a same row may be equal to each other.

Bitlines BL may be arranged parallel to each other in a first direction D1 on the third inter dielectric 130. Each of the bitlines BL may be commonly connected to data storage portions DS of the memory cells MC constituting a single row.

Figure 6:
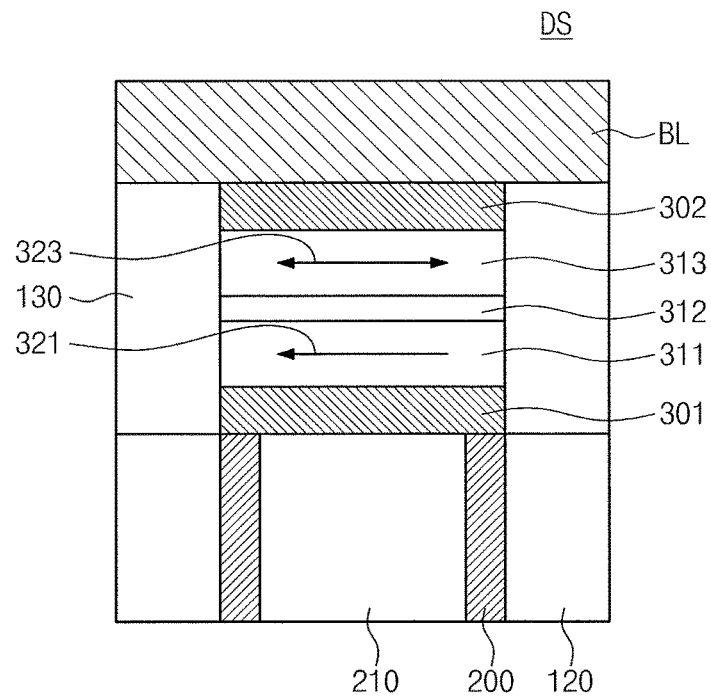
FIGS. 6 and 7 illustrate cross-sectional views of data storage portions according to embodiments, respectively.
Figure 7:
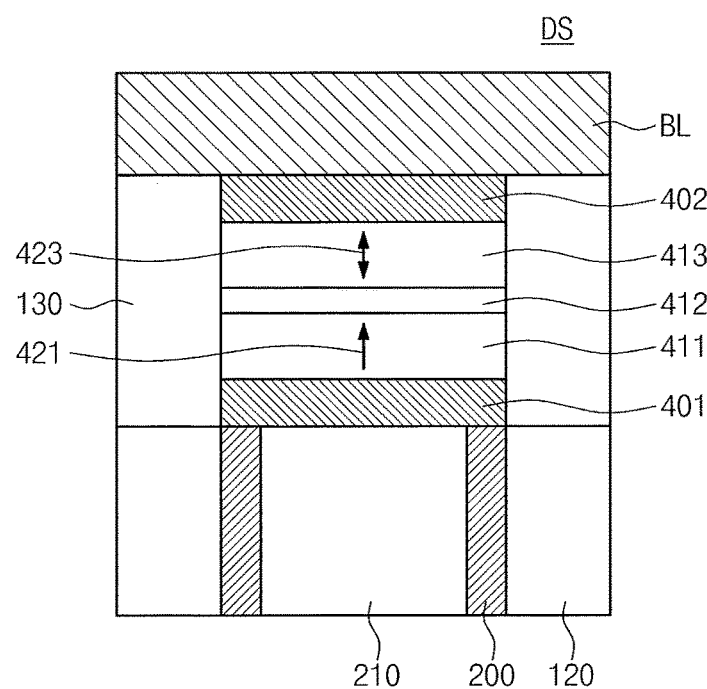

FIGS. 6 and 7 illustrate cross-sectional views of data storage portions according to embodiments, respectively. The data storage portions will be explained in further detail with reference to FIGS. 6 and 7.

Referring to FIG. 6, a data storage portion DS according to an embodiment may include a reference pattern 311, a free pattern 313, and a tunnel barrier pattern 312 disposed between the reference pattern 311 and the free pattern 313. The reference pattern 311 may have a magnetization direction 321 pinned in one direction, and the free pattern 313 may have a magnetization direction 323 variable to be parallel or antiparallel with respect to the magnetization direction 321 of the reference pattern 311. The magnetization directions 321 and 323 of the reference pattern 311 and the free pattern 313 may be parallel to one surface that is in contact with the free pattern 313 of the tunnel barrier pattern 312. The reference pattern 311, the tunnel barrier pattern 312, and the free pattern 313 may constitute a magnetic tunnel junction.

If the magnetization direction 323 of the free pattern 313 is parallel to the magnetization direction 321 of the reference pattern 311, the data storage portion DS may have a first resistance value. If the magnetization direction 323 of the free pattern 313 is antiparallel to the magnetization direction 321 of the reference pattern 311, the data storage portion DS may have a second resistance value. The first resistance value may be smaller than the second resistance value. The data storage portion DS may store logic data using a difference between the first and second resistance values. The magnetization direction 323 of the free pattern 313 may be varied by a spin torque of electrons in program current.

The reference pattern 311 and the free pattern 313 may include a ferromagnetic material. The reference pattern 311 may further include an antiferromagnetic material to pin a magnetization direction of the ferromagnetic material in the reference pattern 311. The tunnel barrier pattern 312 may include at least one of, e.g., magnesium oxide, titanium oxide, aluminum oxide, magnesium-zinc oxide, and magnesium-boron oxide.

The data storage portion DS may further include a bottom electrode 301 and a top electrode 302. The reference pattern 311, the tunnel barrier pattern 312, and the free pattern 313 may be disposed between the bottom electrode 301 and the top electrode 302. As shown FIG. 6, the reference pattern 311, the tunnel barrier pattern 312, and the free pattern 313 may be sequentially disposed on the bottom electrode 301, and the top electrode 302 may be disposed on the free pattern 313. Alternatively, the free pattern 313, the tunnel barrier pattern 312, and the reference pattern 311 may be stacked on the bottom electrode 301. The bottom electrode 301 and the top electrode 302 may include conductive metal nitride, e.g., titanium nitride, tantalum nitride, and tungsten nitride. The top electrode 302 may be electrically connected to the bitline BL on the data storage portion DS.

Referring to FIG. 7, a data storage portion DS according to another embodiment may include a reference perpendicular pattern 411, a free perpendicular pattern 413, and a tunnel barrier pattern 412 disposed between the reference perpendicular pattern 411 and the free perpendicular pattern 413. The reference perpendicular pattern 411 may have a magnetization direction 421 pinned in one direction, and the free perpendicular pattern 413 may have a magnetization direction 423 variable to be parallel or antiparallel to the pinned magnetization direction 421 of the reference perpendicular pattern 411. The magnetization directions 421 and 423 of the reference and free perpendicular patterns 411 and 413 may be perpendicular to one surface of the tunnel barrier pattern 412 that is in contact with the free perpendicular pattern 413.

The reference perpendicular pattern 411 and the free perpendicular pattern 413 may include at least one of a perpendicular magnetic material, e.g., CoFeTb, CoFeGd, and CoFeDy, a perpendicular magnetic material having an L10 structure, CoPt of a hexagonal close packed lattice structure, and a perpendicular magnetic structure. The perpendicular magnetic material having an L10 structure may include at least one of, e.g., FePt of an L10 structure, FePd of an L10 structure, and CoPd of an L10 structure, and CoPt of an L10 structure. The perpendicular magnetic structure may include magnetic and non-magnetic layers that are alternately and repeatedly stacked. For example, the perpendicular magnetic structure may include at least one of, e.g., (Co/Pt)n, (CoFe/Pt)n, (CoFe/Pd)n, (Co/Pd), (Co/Ni)n, (CoNi/Pt)n, (CoCr/Pt)n, and (CoCr/Pd)n (n being the number of stacking). The reference perpendicular pattern 411 may be thicker than the free perpendicular pattern 413, and coercivity of the reference perpendicular pattern 411 is greater than that of the free perpendicular pattern 413.

The tunnel barrier pattern 412 may include at least one of, e.g., magnesium oxide, titanium oxide, aluminum oxide, magnesium-zinc oxide, and magnesium-boron oxide.

The data storage portion DS may further include a bottom electrode 401 and a top electrode 402. As shown in this figure, the reference perpendicular pattern 411, the tunnel barrier pattern 412, and the free perpendicular pattern 413 may be sequentially disposed on the bottom electrode 401, and the top electrode 402 may be disposed on the free pattern 413. Alternatively, the free perpendicular pattern 413, the tunnel barrier pattern 412, and the reference pattern 411 may be stacked on the bottom electrode 401, and the top electrode 402 may be disposed on the reference perpendicular pattern 411. The bottom electrode 401 and the top electrode 402 may be formed of a conductive metal nitride. The top electrode 402 may be electrically connected to the bitline BL on the data storage portion DS.

A method of fabricating a semiconductor device according to embodiments will now be described below in detail with reference to FIGS. 8-12. FIGS. 8 to 12 illustrate cross-sectional views of stages in a method of fabricating a semiconductor device according to an embodiment. Hereinafter, duplicate explanations will be omitted.

Figure 8:
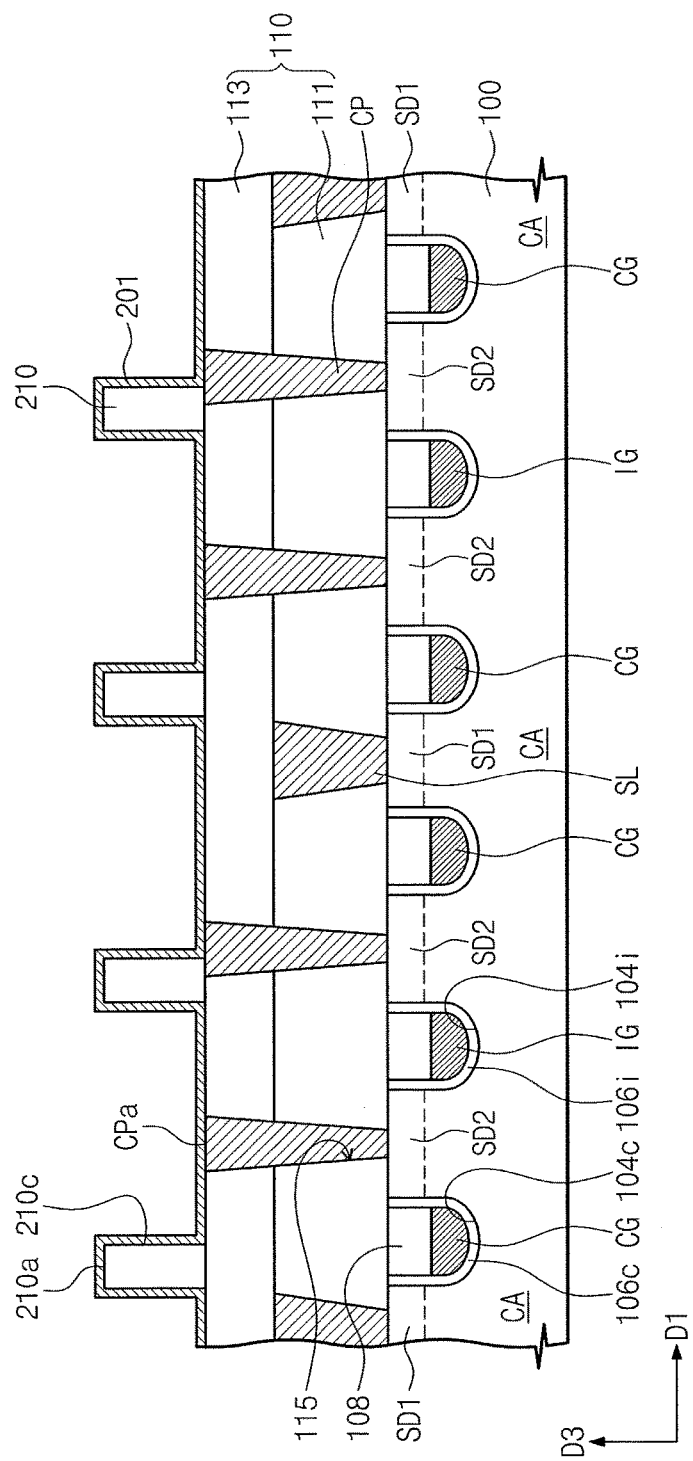
FIGS. 8 to 12 illustrate cross-sectional views of stages in a method of fabricating a semiconductor device according to an embodiment.

Referring to FIG. 8, the substrate 100 may be provided. For example, the substrate 100 may include the device isolation patterns (102 in FIG. 3) to define the active line patterns (ALP in FIG. 1), the isolation gate electrodes IG, and the cell gate electrodes CG. Each cell active portion CA may be defined by a pair of adjacent isolation recess regions 104i. The first doped region SD1 may be formed in each cell active portion CA between a pair of adjacent cell gate electrodes CG, and a pair of the second doped regions SD2 may be formed in both edge regions of each cell active portion CA with the pair of cell gate electrodes CG interposed therebetween, respectively.

The first interlayer dielectric 110 and the contact plugs CP may be formed on the substrate 100. For example, the first lower interlayer dielectric 111 may be formed to cover the substrate 100. The source lines SL may be electrically connected to the first doped region SD through the first lower interlayer dielectric 111. The first upper interlayer dielectric 113 may be formed on the first lower interlayer dielectric 111 and the source lines SL. The first interlayer dielectric 110 is etched such that a contact hole 115 may be formed to expose the second doped region SD2 of the substrate 100. A conductive material fills the contact hole 115 such that the contact plug CP may be formed to be electrically connected to the second doped region SD2.

A pillar layer (not shown) may be formed on the first interlayer dielectric 110 to cover the first interlayer dielectric 110. The pillar layer may include a conductive material or an insulating material. Pillar patterns 210 may be isolated, e.g., formed, by etching the pillar layer. A central axis of the pillar pattern 210 may be different from that of the contact plug CP. For example, the central axis of the pillar pattern 210 may be laterally offset from the central axes of contact plugs CP along the first direction D1. When viewed from the top, the pillar pattern 210 may be arranged to be identical or similar to the data storage portion DS shown in FIG. 1.

A conductive layer 201 may be formed on the first interlayer dielectric 110. The conductive layer 201 may conformally cover a top surface CPa of the contact plug CP, the first interlayer dielectric 110, and the pillar pattern 210. For example, the conductive layer 201 may, e.g., continuously, cover a sidewall 210c and a top surface 201a of the pillar pattern 210. The conductive layer 201 may include a metal or metal nitride, e.g., titanium nitride.

Figure 9:
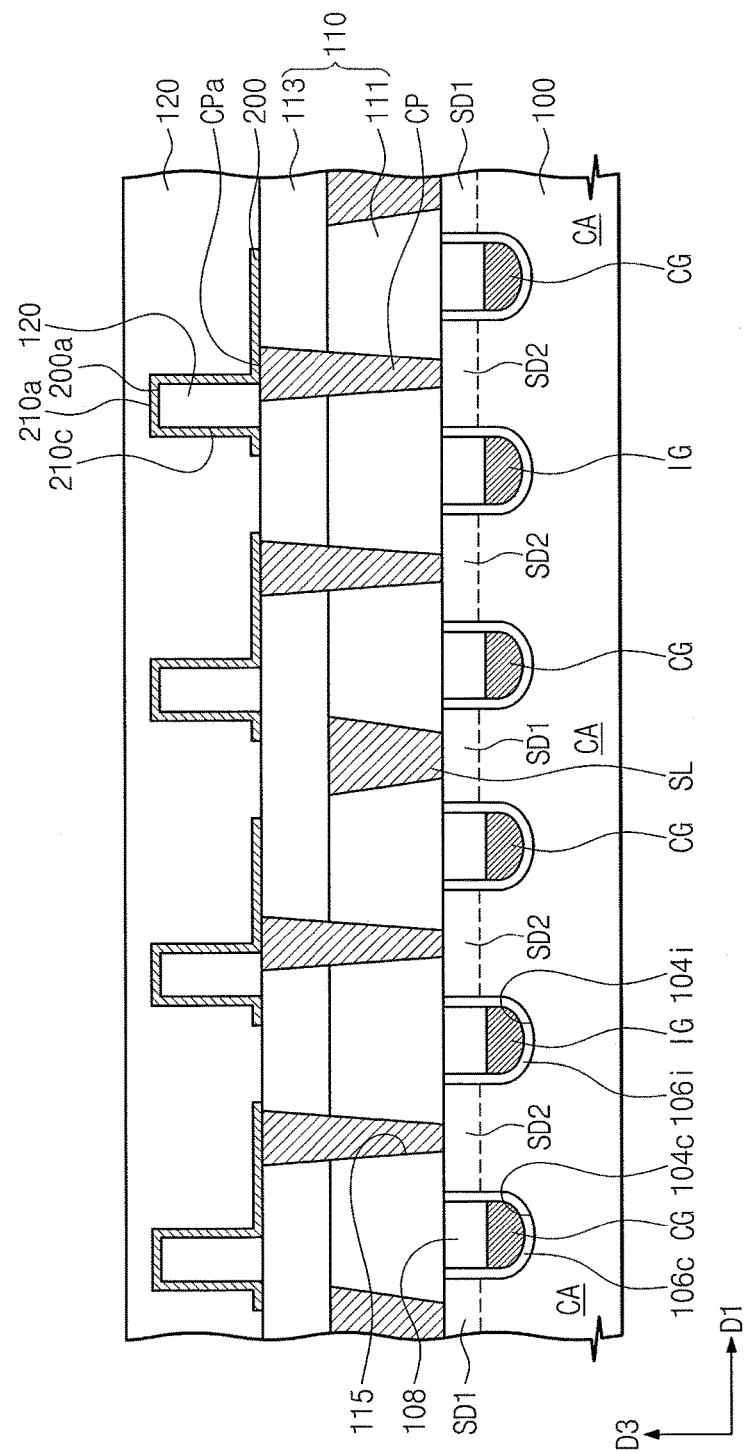

Referring to FIG. 9, the pad 200 may be formed on the first interlayer dielectric 110. For example, the pad 200 may be isolated, e.g., formed, by patterning the conductive layer 201 (in FIG. 8). The conductive layer 201 may be patterned by means of a photoresist process and an etch process. The uppermost surface 200a of the pad 200 may have a higher level than the top surface 210a of the pillar pattern 210. The second interlayer dielectric 120 may be formed on the first interlayer dielectric 110. The second interlayer dielectric 120 may be provided on the top surface 210a of the pillar pattern 210, the sidewall 210c of the pillar pattern 210, and the top surface CPa of the contact plug CP. The second interlayer dielectric 120 may cover the pad 200.

Figure 10:
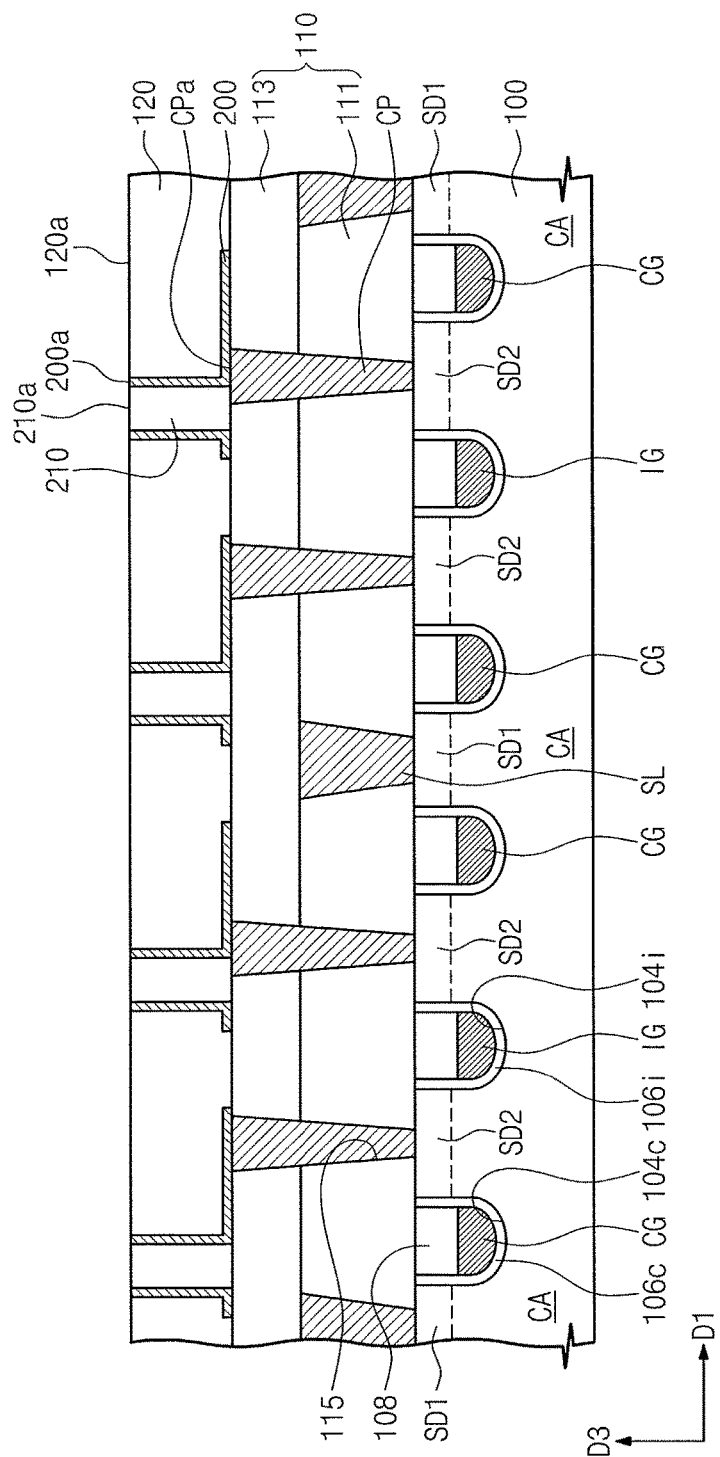

Referring to FIG. 10, the second interlayer dielectric 120 may be planarized. The uppermost surface 120a of the second interlayer dielectric 120 may have the same level as the uppermost surface 200a of the pad 200. In this case, the pad 200 on the top surface 210a of the pillar pattern 210 may be removed. Thus, the uppermost surface 200a of the pad 200 may have the same level as the top surface 210a of the pillar pattern 210. In another embodiment, the pad 200 provided on the top surface 210a of the pillar pattern 210 may remain. In this case, the pad 200 shown as an example in FIG. 4 may be formed.

Figure 11:
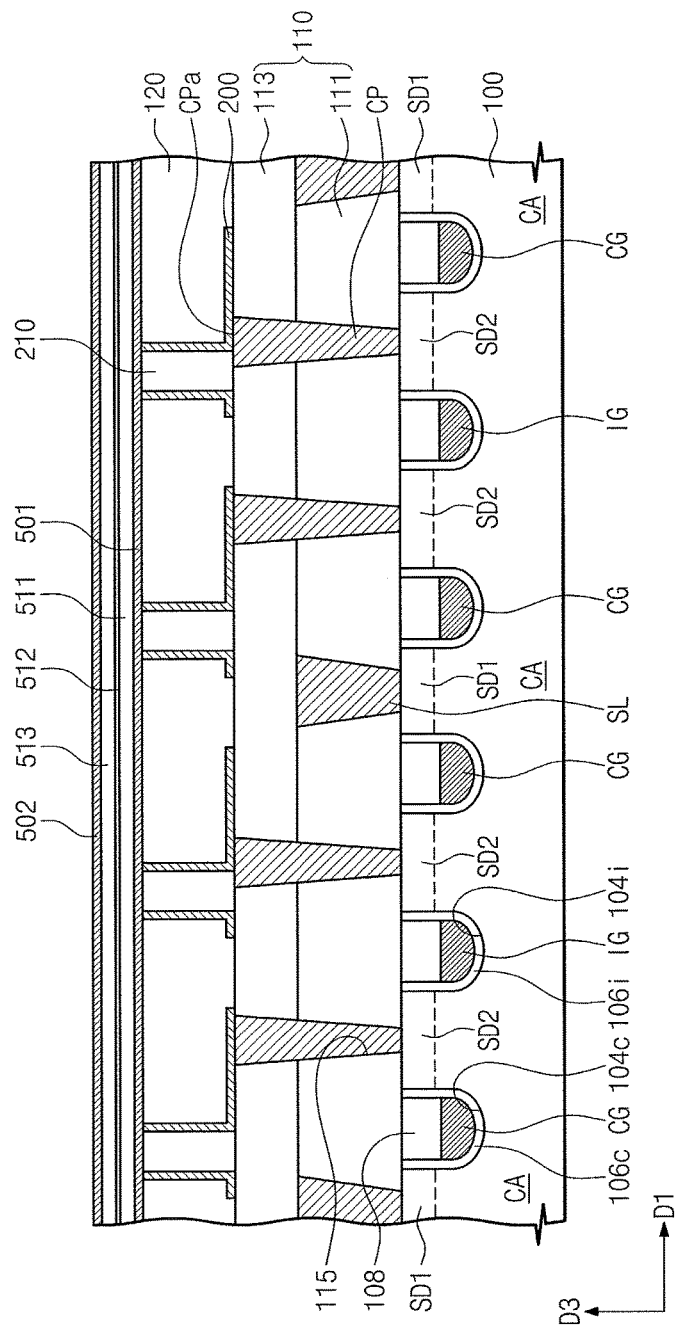

Referring to FIG. 11, a bottom electrode layer 501, a first magnetic material layer 511, an insulating material layer 512, a second magnetic material layer 513, and a top electrode layer 502 may be sequentially formed on the substrate 100. The bottom electrode layer 501 and the top electrode layer 502 may include conductive metal nitride, e.g., titanium nitride, tantalum nitride, and/or tungsten nitride. The insulating material layer 512 may include at least one of, e.g., magnesium oxide, titanium oxide, aluminum oxide, magnesium-zinc oxide, and magnesium-boron oxide. In an embodiment, the first magnetic material layer 511 and the second magnetic material layer 513 may include a ferromagnetic material. Any one of the first and second magnetic material layers 511 and 513 may further include an antiferromagnetic material. In another embodiment, the first and second magnetic material layers 511 and 513 may include at least one of a perpendicular magnetic material, e.g., CoFeTb, CoFeGd, and CoFeDy, a perpendicular magnetic material having an L10 structure, CoPt of a hexagonal close packed lattice structure, and a perpendicular magnetic structure explained previously with reference to FIG. 7.

Figure 12:
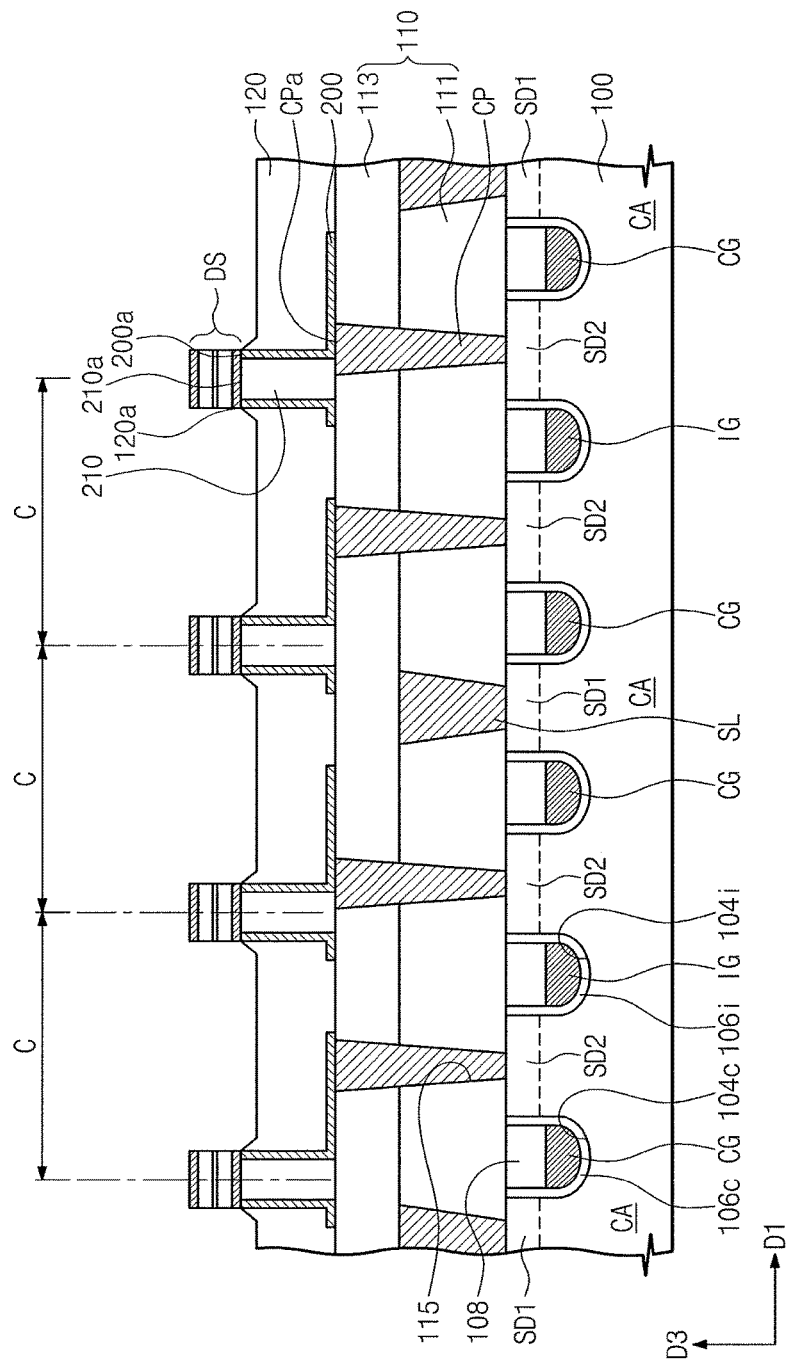

Referring to FIG. 12, the data storage portion DS may be formed on the pillar pattern 210. For example, the bottom electrode layer 501, the first magnetic material layer 511, the insulating material layer 512, the second magnetic material layer 513, and the top electrode layer 502 in FIG. 11 may be etched to form the data storage portion DS. The data storage portion DS may be the data storage portion DS explained previously with reference to FIG. 6 or in FIG. 7. The central axis of the data storage portion DS may be laterally offset from the central axis of the contact plug CP. The data storage portion DS may cover the top surface 210a of the pillar pattern 210 and the uppermost surface 200a of the pad 200.

If the pillar pattern 210 is omitted, the pad 200 may be exposed to an etch process during formation of the data storage portion DS. Therefore, according to embodiments, the pillar pattern 210 is provided, and the second interlayer dielectric 120 may cover the pad 200 during a process of forming the data storage portion DS. In particular, while a portion of the second interlayer dielectric 120 may be etched during formation of the data storage portion DS, the second interlayer dielectric 120 still covers the pad 200 even after the data storage portion DS has been formed. As such, the pad 200 may not be exposed to the etch process during the formation of the data storage portion DS. Thus, etch byproducts of the pad 200 may not be redeposited on the sidewall of the data storage portion DS. Short-circuit of the data storage portion DS fabricated according to embodiments may be prevented and reliability of a semiconductor device according to embodiments may be improved.

In memory cells MC constituting a single row, distances C between adjacent data storage portions DS may be equal to each other. Thus, etch byproducts of the bottom electrode layer (501 in FIG. 10), the first magnetic material layer (511 in FIG. 10), the insulating material layer (512 in FIG. 10), the second magnetic material layer (513 in FIG. 10) or the top electrode layer (502 in FIG. 10) may be prevented from being deposited on the sidewall of the data storage portion DS during the formation of the data storage portion DS.

Returning to FIG. 1, the third interlayer dielectric 130 may be formed on the second interlayer dielectric 120. The bitline BL may be formed on the data storage portion DS to be electrically connected to the data storage portion DS. For example, each bitline BL may be commonly connected to respective data storage portions DS of memory cells MC constituting a single row.

Figure 13:
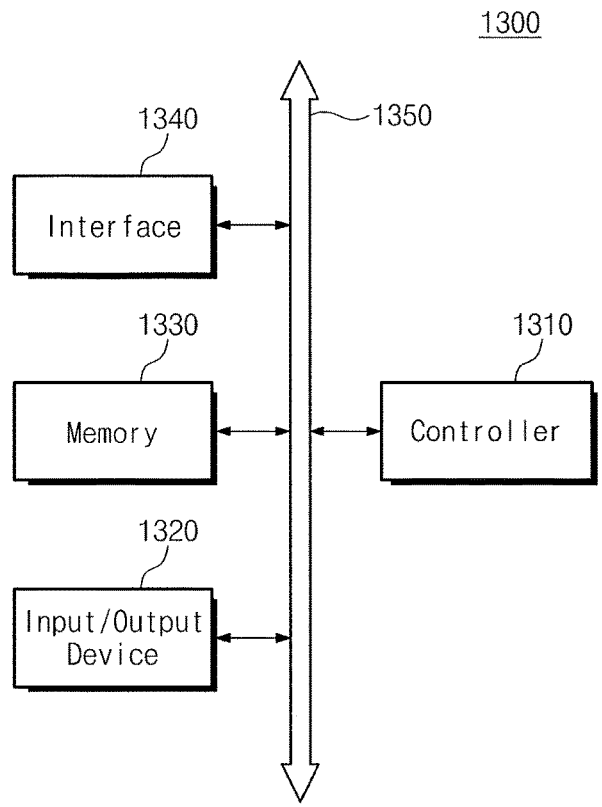
FIG. 13 illustrates a block diagram of an example of an electronic device including semiconductor devices according to embodiments.
Figure 14:
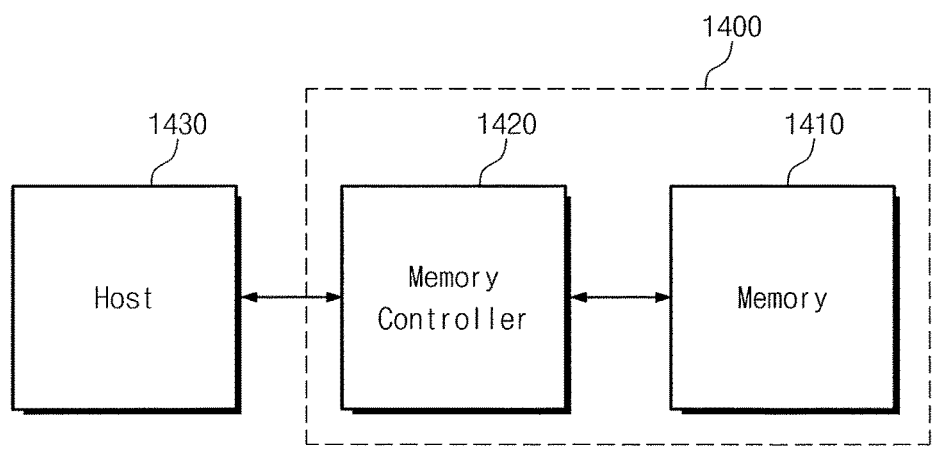
FIG. 14 illustrates a block diagram of an example of a memory system including semiconductor devices according to embodiments.

FIG. 13 illustrates a block diagram of an example of an electronic device including semiconductor devices according to embodiments, and FIG. 14 illustrates a block diagram of an example of a memory system including semiconductor devices according to embodiments.

Referring to FIG. 13, an electronic device 1300 including at least one of semiconductor devices 1 and 2 according to embodiments may be, e.g., a personal digital assistant (PDA), a laptop computer, a portable computer, a web tablet, a wireless phone, a mobile phone, a digital music player, a wired or wireless electronic device, or a complex electronic device including at least two thereof. The electronic device 1300 may include a controller 1310, an input/output device 1320, e.g., a keyboard, a keypad, or a display device, a memory 1330, and a wireless interface 1340 which are connected via a bus 1350.

The controller 1310 may include, e.g., at least one microprocessor, a digital signal processor, microcontroller, or the like. The memory 1330 may be used to store, e.g., a command executed by the controller 1310. The memory 1330 may be used to store user data and may include semiconductor devices according to embodiments. The electronic device 1300 may use the wireless interface 1340, e.g., for transmitting/receiving data to/from a wireless communications network that communicates using an RF signal. The wireless interface 1340 may include, e.g., an antenna, a wireless transceiver or the like.

The electronic system 1300 may be used to implement a communication interface protocol for a communication system, e.g., Code Division Multiple Access (CDMA), Global System for Mobile Communications (GSM), American Digital Communications (NADC), Enhance Time Division Multiple Access (E-TDMA), Wideband Code Division Multiple Access (WCDMA), CDMA2000, Wi-Fi, Muni Wi-Fi, Bluetooth, Digital Enhanced Cordless Telecommunications (DECT), Wireless Universal Serial Bus (USB), Flash Orthogonal Frequency-Division Multiplexing (Flash-OFDM), Institute of Electrical and Electronics Engineers (IEEE) 802.20, General Packet Radio Service (GPRS), iBurst, Wireless Broadband (WiBro), Worldwide Interoperability for Microwave Access (WiMAX), WiMAX-Advanced, Universal Mobile Telecommunications System—Time-Division Duplexing (UMTS-TDD), High Speed Packet Access (HSPA), Enhanced Voice-Data Only (EVDO), Long-Term Evolution (LTE)-Advanced, and Multichannel Multipoint Distribution Service (MMDS).

Referring to FIG. 14, at least one of semiconductor devices 1 and 2 according to embodiments may be used to implement a memory system 1400. The memory system 1400 may include a memory device 1410 to store mass data and a memory controller 1420. The memory controller 1420 controls the memory device 1410 to read or write stored data from or into the memory device 1410 in response to a read/write request of a host 1430. The memory controller 1420 may constitute an address mapping table for mapping an address provided from the host 1430, e.g., a mobile device or a computer system, to a physical address of the memory device 1410. The memory device 1410 may include the foregoing semiconductor devices 1 and 2 according to embodiments.

A package, on which at least one of the semiconductor devices 1 and 2 according to embodiments are mounted, may further include a controller to control the semiconductor device 1410 and/or a logic device.

By way of summary and review, according to embodiments, a central axis of a pillar pattern may be laterally offset from a central axis of a contact plug. A data storage portion may be provided on the pillar pattern and be electrically connected to the contact plug through a pad. A second interlayer dielectric may be formed on the first interlayer dielectric and on a sidewall of the pillar pattern to cover the pad. During formation of the data storage portion, the pad may not be exposed to an etch process. Since etch byproducts of the pad are not redeposited on a sidewall of the data storage portion, short-circuit of the data storage portion may be prevented and a semiconductor device according to embodiments may have improved reliability and may be highly integrated.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
an interlayer dielectric on a semiconductor substrate;
a contact plug penetrating the interlayer dielectric;
a pillar pattern disposed on the interlayer dielectric and having a central axis laterally offset from a central axis of the contact plug;
a pad extending on the contact plug and along an outermost sidewall of the pillar pattern, the pad being electrically connected to the contact plug; and
a data storage portion on the pillar pattern and electrically connected to the pad,
wherein the pad covers the outermost sidewall of the pillar pattern.

2. The semiconductor device as claimed in claim 1, wherein the data storage portion is in contact with an uppermost surface of an extending portion of the pad.

3. The semiconductor device as claimed in claim 2, wherein a top surface of the pillar pattern is at a same level as an uppermost surface of the pad, the data storage portion covering the top surface of the pillar pattern and the uppermost surface of the pad.

4. The semiconductor device as set claimed in claim 2, wherein the extending portion of the pad further extends between the pillar pattern and the data storage portion.

5. The semiconductor device as claimed in claim 1, further comprising an upper interlayer dielectric on the interlayer dielectric, the upper interlayer dielectric covering the sidewall of the pillar pattern and the pad.

6. The semiconductor device as claimed in claim 1, wherein a central axis of the data storage portion is laterally offset from the central axis of the contact plug, the central axis of the data storage portion, the central axis of the contact plug, and the central axis of the pillar pattern being perpendicular to a top surface of the substrate.

7. The semiconductor device as claimed in claim 1, wherein the pillar pattern includes a conductive material.

8. The semiconductor device as claimed in claim 1, wherein the pillar pattern includes an insulating material.

9. The semiconductor device as claimed in claim 1, wherein the outermost sidewall of the pillar pattern extends along a direction normal to a bottom of the semiconductor substrate, the pad being directly on the outermost sidewall of the pillar pattern.

10. The semiconductor device as claimed in claim 1, wherein the pad includes a first portion along the outermost sidewall of the pillar pattern and a second portion perpendicular to the first portion and extending on the contact plug.

11. A semiconductor device, comprising:
a substrate including a plurality of memory cells; and an interlayer dielectric covering the substrate,
wherein each of the memory cells includes:
  a contact plug penetrating the interlayer dielectric,
  a pillar pattern on the interlayer dielectric and having a different central axis from that of the contact plug, the central axes of the pillar pattern and the contact plug extending along respective longitudinal directions of the pillar pattern and the contact plug,
  a pad covering the contact plug and being electrically connected to the contact plug, the pad extending along a sidewall of the pillar pattern, and
  a data storage portion on the pillar pattern and electrically connected to the pad, and
wherein among the memory cells constituting a single row, a distance between central axes of a contact plug and a pillar pattern included in one memory cell is different from a distance between axes of a contact plug and a pillar pattern included in an adjacent memory cell.

12. The semiconductor device as claimed in claim 11, wherein the data storage portion is in contact with an uppermost surface of an extending portion of the pad.

13. The semiconductor device as claimed in claim 11, wherein distances between the data storage portions included in the memory cells constituting a single row are equal to each other.

14. The semiconductor device as claimed in claim 11, further comprising an upper interlayer dielectric between pillar patterns of the memory cells to cover corresponding pads, an uppermost surface of the upper interlayer dielectric having a same level as uppermost surfaces of the pads.

15. A semiconductor device, comprising:
an interlayer dielectric on a semiconductor substrate;
a contact plug penetrating the interlayer dielectric;
a pillar pattern on the interlayer dielectric and having a central axis laterally offset from a central axis of the contact plug;
a data storage portion on the pillar pattern;
a pad electrically connecting the data storage portion to the contact plug, the pad continuously extending along a sidewall of the pillar pattern and on at least a portion of an upper surface of the contact plug; and
an upper interlayer dielectric on the interlayer dielectric, the upper interlayer dielectric covering the pad,
wherein the pad covers the sidewall of the pillar pattern, and
wherein the upper interlayer dielectric completely covers the pad, a portion of the pad separating the sidewall of the pillar pattern from the upper interlayer dielectric.

16. The semiconductor device as claimed in claim 15, wherein an uppermost surface of the upper interlayer dielectric is coplanar with an uppermost surface of the pillar pattern, the data storage portion being above the upper interlayer dielectric.

17. The semiconductor device as claimed in claim 15, wherein the upper interlayer dielectric completely separates the data storage portion from an outer lateral side of the pad, the outer lateral side of the pad extending along the sidewall of the pillar pattern.

18. The semiconductor device as claimed in claim 15, wherein a central axis of the data storage portion is coextensive with the central axis of the pillar pattern.

19. The semiconductor device as claimed in claim 15, wherein the data storage portion is a plurality of data storage portions on a plurality of corresponding pillar patterns, the data storage portions in a same row along a first direction being positioned at equal intervals from each other.

20. The semiconductor device as claimed in claim 15, wherein the pillar pattern is above the contact plug along a second direction normal to the substrate, the central axes of the pillar pattern and the contact plug being spaced apart from each other along the first direction perpendicular to a second direction.

* * * * *